(12) United States Patent
Yoon

(10) Patent No.: US 9,761,634 B2
(45) Date of Patent: Sep. 12, 2017

(54) ELECTRONIC DEVICE

(71) Applicant: SK hynix Inc., Icheon-Si (KR)

(72) Inventor: Sung-Joon Yoon, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 66 days.

(21) Appl. No.: 14/848,164

(22) Filed: Sep. 8, 2015

(65) Prior Publication Data
US 2016/0181317 A1   Jun. 23, 2016

(30) Foreign Application Priority Data
Dec. 17, 2014 (KR) .................... 10-2014-0182532

(51) Int. Cl.
*G11C 11/16* (2006.01)
*H01L 27/22* (2006.01)
(Continued)

(52) U.S. Cl.
CPC ........ *H01L 27/222* (2013.01); *G06F 12/0875* (2013.01); *G11C 11/161* (2013.01);
(Continued)

(58) Field of Classification Search
CPC .................................................. G11C 11/161
(Continued)

(56) References Cited

U.S. PATENT DOCUMENTS

2005/0184839 A1* 8/2005 Nguyen ............... B82Y 25/00
                                                        335/173
2005/0254286 A1* 11/2005 Valet ..................... H01L 43/08
                                                        365/158
(Continued)

FOREIGN PATENT DOCUMENTS

KR   1020070042891 A   4/2007
KR   1020090037824 A   4/2009

OTHER PUBLICATIONS

J. C. Slonczewski, Current-driven excitation of magnetic layers, 1996, Journal of Magnetism and Magnetic Materials, 159, pp. 1.1-1.7.*

(Continued)

*Primary Examiner* — Hoai V Ho
*Assistant Examiner* — Jay Radke
(74) *Attorney, Agent, or Firm* — Perkins Coie LLP

(57) ABSTRACT

This patent document provides an electronic device capable of improving the characteristics of a variable resistance element. An electronic device in accordance with an implementation of this document includes semiconductor memory, and the semiconductor memory includes a variable resistance element capable of being included in the semiconductor memory, and including a fixed layer, a tunnel barrier layer, and a variable layer laminated therein, wherein the variable resistance element is capable of allowing a slope of a graph of a switching current density as a function of an external magnetic field to be proportional to the square of "H/Hk" when the magnetization directions of the fixed layer and the variable layer are switched from a parallel state to an antiparallel state. In accordance with the electronic device of this patent document, the characteristics of the variable resistance element can be improved.

16 Claims, 8 Drawing Sheets

(51) Int. Cl.
H01L 43/02 (2006.01)
H01L 43/08 (2006.01)
H01L 43/10 (2006.01)
G06F 12/0875 (2016.01)

(52) U.S. Cl.
CPC .............. *H01L 43/02* (2013.01); *H01L 43/08* (2013.01); *H01L 43/10* (2013.01); *G06F 2212/452* (2013.01)

(58) Field of Classification Search
USPC .................................................. 365/148, 158
See application file for complete search history.

(56) References Cited

U.S. PATENT DOCUMENTS

2011/0170339 A1* 7/2011 Wunderlich ........ G11C 11/1675
365/158
2013/0058156 A1* 3/2013 Ohno .................... H01L 27/228
365/158

OTHER PUBLICATIONS

Ki-Seung Lee et al., "Threshold current for switching of a perpendicular magnetic layer induced by spin Hall effect", Mar. 20, 2013, Applied Phys Lett, 102.*

M T. Rahman et al., "Reduction of swtching current density in perpendicular magnetic tunnel junctions by tuning the anisotropy of the CoFeB free layer", Feb. 28, 2012, Journal of Applied Physics, 111.*

Kangho Lee et al., "Control of Switching Current Asymmetry by Magnetostatic Field in MgO-Based Magnetic Tunnel Junctions", Dec. 2009, IEEE Electron Device Letters, vol. 30, No. 12. pp. 1353-1355.*

* cited by examiner

ELECTRONIC DEVICE

CROSS-REFERENCE TO RELATED APPLICATIONS

This patent document claims priority and benefits of Korean Patent Application No. 10-2014-0182532, entitled "ELECTRONIC DEVICE" and filed on Dec. 17, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which an electronic device capable of improving the characteristics of a variable resistance element is provided.

In one aspect, an electronic device is provided to include a semiconductor memory that includes: a variable resistance element comprising a fixed layer, a variable layer, and a tunnel barrier layer interposed between the fixed layer and the variable layer, wherein the variable resistance element has a characteristic that a switching current density of the variable resistance element is a function of an external magnetic field existing around the variable resistance element, the function being proportional to the square of "H/Hk" (wherein "H" represents the external magnetic field, and "Hk" represents a magnetic anisotropy field of the variable resistance element) when the magnetization directions of the fixed layer and the variable layer are switched from a parallel state to an antiparallel state.

In some implementations, the variable resistance element is structured so that, as the external magnetic field increases, the switching current density of the variable resistance element increases. In some implementations, the variable layer and the fixed layer include ferromagnetic materials. In some implementations, the tunnel barrier layer includes an oxide. In some implementations, the switching current of the variable resistance element is minimized when the fixed layer has an optimized anisotropy constant Ku.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another aspect, an electronic device is provided to include a semiconductor memory that includes: a variable resistance element comprising a fixed layer, a variable layer, a tunnel barrier layer interposed between the fixed layer and the variable layer and switched between a parallel state and an antiparallel state, wherein the parallel state is defined when the variable layer and the fixed layer has parallel magnetization directions from each other and the antiparallel state is defined when the variable layer and the fixed layer has antiparallel magnetization directions from each other, wherein the variable resistance element has a switching current density expressed as a function of an external magnetic field, wherein the switching current density is a first function of the external magnetic field when the variable resistance element switches from the parallel state to the antiparallel state and the switching current density is a second function of the external magnetic field when the variable resistance element switches from the antiparallel state to the parallel state, and the first function has a slope with an absolute value greater than or equal to that of the second function when an anisotropy constant value of the fixed layer is high.

In some implementations, the first function has a characteristic that as the external magnetic field increases, the switching current density of the variable resistance element increases. In some implementations, the second function has a characteristic that as the external magnetic field increases, the switching current density of the variable resistance element decreases. In some implementations, the variable layer and the fixed layer include ferromagnetic materials. In some implementations, the tunnel barrier layer includes an oxide. In some implementations, the switching current of the variable resistance element is minimized when the fixed layer has an optimized anisotropy constant Ku.

In another aspect, a method of providing an electronic device comprising a semiconductor memory is provided, wherein the semiconductor memory includes a variable resistance element including a fixed layer, a variable layer, a tunnel barrier layer interposed between the fixed layer and the variable layer and switched between a parallel state and an antiparallel state, wherein the parallel state is defined when the variable layer and the fixed layer has parallel magnetization directions from each other and the antiparallel state is defined when the variable layer and the fixed layer has antiparallel magnetization directions from each other. The method may comprise: configuring the variable resistance element with a first anisotropy constant value Ku; deriving a first relationship that represents a change of switching current density of the variable resistance element according to an external magnetic field existed around the variable resistance element when the variable resistance element switches from the parallel state to the antiparallel state; deriving a second relationship that represents a change of switching current density of the variable resistance element according to the external magnetic field when the variable resistance element switches from the antiparallel state to the parallel state; comparing the first relationship and the second relationship; and changing the first Ku value to a second Ku value depending on the comparison result.

In some implementations, the configuring of the variable resistance element including determining the first anisotropy constant value Ku. In some implementations, the comparing of the first relationship and the second relationship including: determining whether the first relationship is expressed as a linear function having a slope with an absolute value greater than or equal to that of the second relationship. In some implementations, the changing of the first Ku value including increasing the first Ku value.

DETAILED DESCRIPTION

Figure 1:
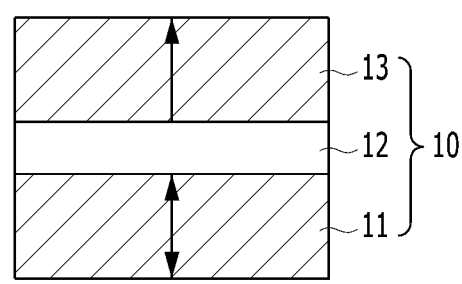
FIG. 1 is a cross-sectional view illustrating the configuration of an exemplary variable resistance element in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

According to the following implementations of the present disclosure, a semiconductor device may include one or more variable resistance elements. Each variable resistance element may store mutually different data in such a manner that each variable resistance element is switched between mutually different resistance states depending on a voltage or current applied thereto. Each variable resistance element may function as a memory cell.

In accordance with an implementation, a variable resistance element may include a magnetic tunnel junction (MTJ) structure including: a variable layer having a variable magnetization direction; a fixed layer having a fixed magnetization direction; and a tunnel barrier layer interposed between the variable layer and the fixed layer. Here, the variable layer has a variable magnetization direction and can store data according to magnetization directions, and may be referred to as a free layer, a storage layer, or the like. The fixed layer may have a fixed magnetization direction, and may be referred to as a pinned layer, a reference layer, or the like. In such a variable resistance element, depending on a voltage or current applied thereto, the magnetization direction of the variable layer varies between a state parallel to the magnetization direction of the fixed layer and a state antiparallel to the magnetization direction of the fixed layer. Accordingly, the variable resistance element can be switched between a low-resistance state and a high-resistance state. The magnetization direction of the variable layer may vary depending on spin transfer torque. In some implementations, the magnetization directions of the variable layer and the fixed layer can be perpendicular to or parallel to each corresponding layer surface.

Generally, the switching current of a variable resistance element is greatly influenced by not only the characteristics of a variable layer, but also by the characteristics of a fixed layer. Especially, since the switching current is greatly influenced by the value of the anisotropy constant "Ku" of a fixed layer, it is very important to optimize the value of the anisotropy constant "Ku" of the fixed layer. Once the value of the anisotropy constant "Ku" of a fixed layer is optimized, switching current can be minimized. Therefore, when switching current is minimized, the value of the anisotropy constant "Ku" of a fixed layer is optimized.

There have been numerous efforts to form a variable resistance element having an optimized anisotropy constant value. For example, numerous elements have been manufactured for tests to compare switching current values and determine the optimized switching current. However, those efforts require much time and cost.

Therefore, there is a need for a method for forming a variable resistance element having an optimized value of the anisotropy constant "Ku" with minimized time and at a reduced cost.

FIG. 1 is a cross-sectional view illustrating the configuration of an exemplary variable resistance element in accordance with an implementation.

As illustrated in FIG. 1, a variable resistance element 10 may include a magnetic tunnel junction (MTJ) structure including: a variable layer 11 having a variable magnetization direction; a fixed layer 13 having a fixed magnetization direction; and a tunnel barrier layer 12 interposed between the variable layer 11 and the fixed layer 13.

Here, the variable layer 11 and the fixed layer 13 may include ferromagnetic materials. The ferromagnetic materials may include alloys having Fe, Ni or Co as a main ingredient, for example, a Fe—Pt alloy, a Fe—Pd alloy, a Co—Pd alloy, a Co—Pt alloy, a Fe—Ni—Pt alloy, a Co—Fe—Pt alloy, a Co—Ni—Pt alloy, or a Co—Fe alloy.

The magnetization directions of the variable layer 11 and the fixed layer 13 may be perpendicular to the layer surfaces. For example, as shown in FIG. 1 (see arrows), the magnetization direction of the variable layer 11 may be switched between a direction from top to bottom and a direction from bottom to top, and the magnetization direction of the fixed layer 13 may be fixed in a direction from bottom to top.

The tunnel barrier layer 12 may include an insulating oxide, for example, an oxide including MgO, CaO, SrO, TiO, VO, or NbO, and the like. The tunnel barrier layer 12 allows tunneling of electrons, and can function to change the magnetization direction of the variable layer 11.

The variable resistance element 10 may additionally include layers (not shown) having various uses, such as improving the characteristics of the MTJ structure or facilitating the manufacturing process of the variable resistance element 10.

The variable resistance element 10 may be influenced by various conditions. Such examples may be expressed by the following equations.

The switching current "Ic" of the variable layer 11 may be expressed as equation 1 below:

$$I_C = \frac{\alpha * \Delta}{g(\theta)} = \frac{\alpha}{g(\theta)} \frac{K_u V}{k_B T} \quad (1)$$

In equation 1 above, "a" represents a damping constant, "$K_u$" represents an anisotropy constant, "V" represents a variable layer volume (storage layer volume), "$g(\theta)$" represents an efficiency factor, "$k_B$" represents a Boltzmann constant, "T" represents a Kelvin temperature, and "$\Delta$" represents a thermal stability coefficient.

Referring to equation 1, it can be understood that optimized switching current "Ic" is proportional to the value of the thermal stability coefficient "$\Delta$" and/or the anisotropy constant "$K_u$". The thermal stability coefficient "$\Delta$" of the variable resistance element 10, shown in equation 1 above, may be expressed as equation 2 below:

$$\Delta = \frac{K_u V}{k_B T} \quad (2)$$

The thermal stability coefficient in equation 2 expresses the thermal stability coefficient of the variable resistance element itself, without any influences of an external magnetic field. When an external magnetic field "H field" exists, an optimized thermal stability coefficient may be expressed as equation 3:

$$\Delta = \Delta_0 \left(1 - \frac{H}{H_k}\right)^2 \quad (3)$$

In equation 3, "$H_k$" represents the magnetic anisotropy field of the variable resistance element itself, and "H" represents an external magnetic field.

Referring to equations 1 and 3 shown above, it can be understood that an optimized switching current of a variable resistance element is proportional to the square of "$H/H_k$".

Consequently, a variable resistance element having an optimized switching current may exhibit the property that switching current which is a function of an external magnetic field is proportional to the square of "$H/H_k$".

Meanwhile, when the anisotropy constant "$K_u$" of the fixed layer 13 is not sufficient, there is a case that switching current which is a function of an external magnetic field is proportional to "$H/H_k$." In this case, in order to form a variable resistance element having optimized switching current, it is necessary to determine an anisotropy constant value which causes switching current which is a function of an external magnetic field to be proportional to the square of "$H/H_k$" instead of "$H/H_k$".

Hereinafter, a case that switching current is proportional to the square of "$H/H_k$" will be referred to as "model A", and a case that switching current is proportional to "$H/H_k$" will be referred to as "model B". Further, it will be discussed below when the anisotropy constant value can make switching current of the variable resistance element be proportional to the square of "$H/H_k$" using FIGS. 2a and 2b.

Figure 2A:
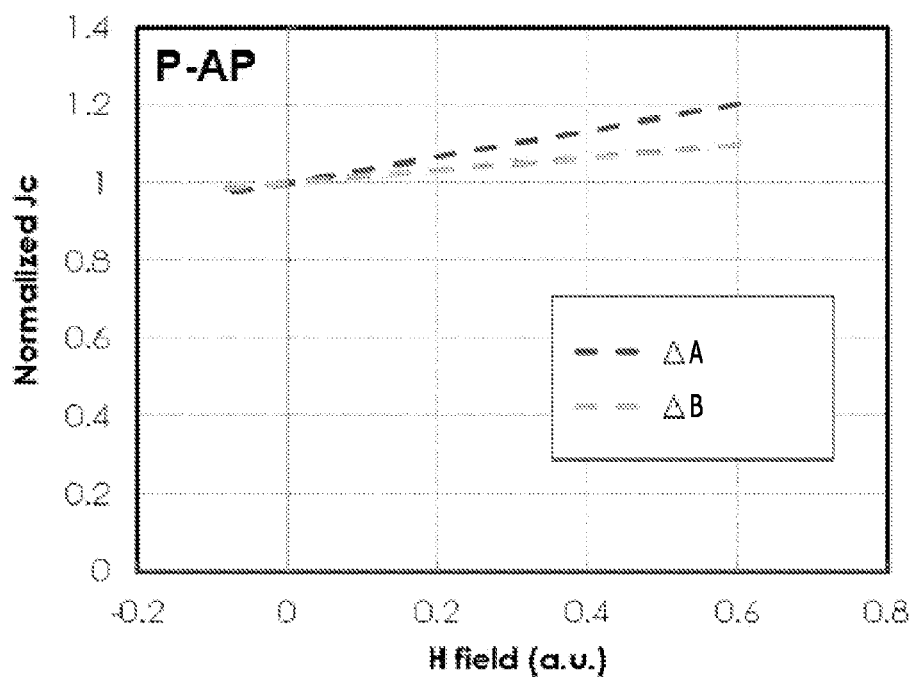
FIGS. 2A and 2B are graphs which show switching current densities Jc as a function of an external magnetic field on P-AP and AP-P, respectively, when the switching current densities follow model A and model B.
Figure 2B:
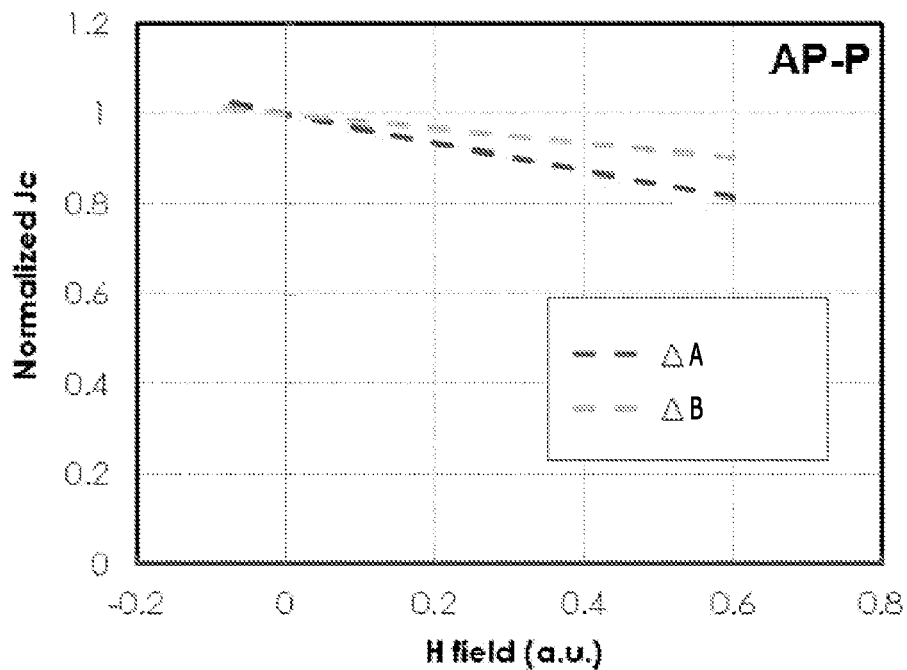
Figure 3A:
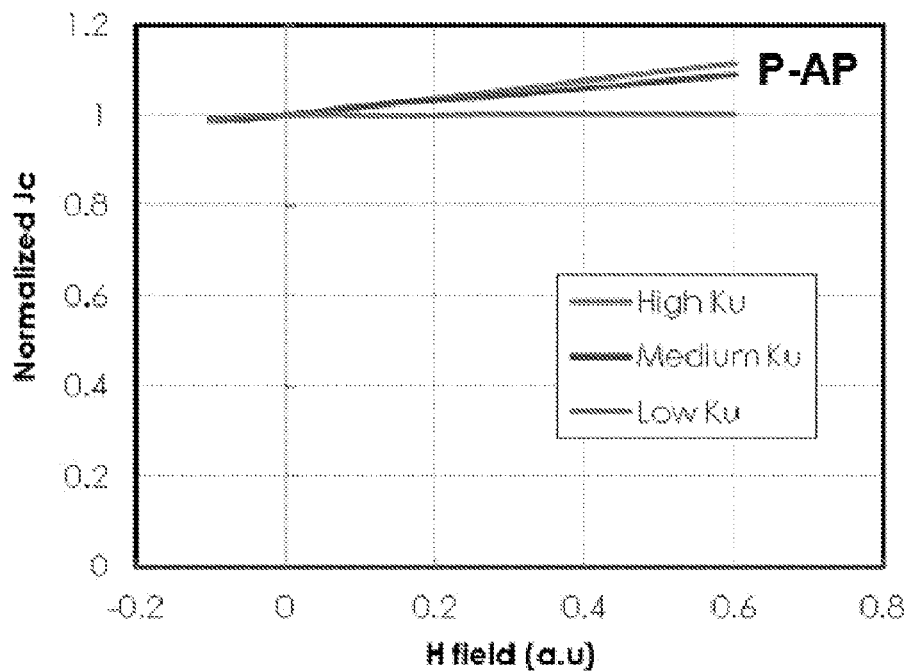
FIGS. 3A and 3B are graphs showing switching current densities measured as a function of an external magnetic field on P-AP and AP-P, respectively, while the anisotropy constant value of a fixed layer is varying.
Figure 3B:
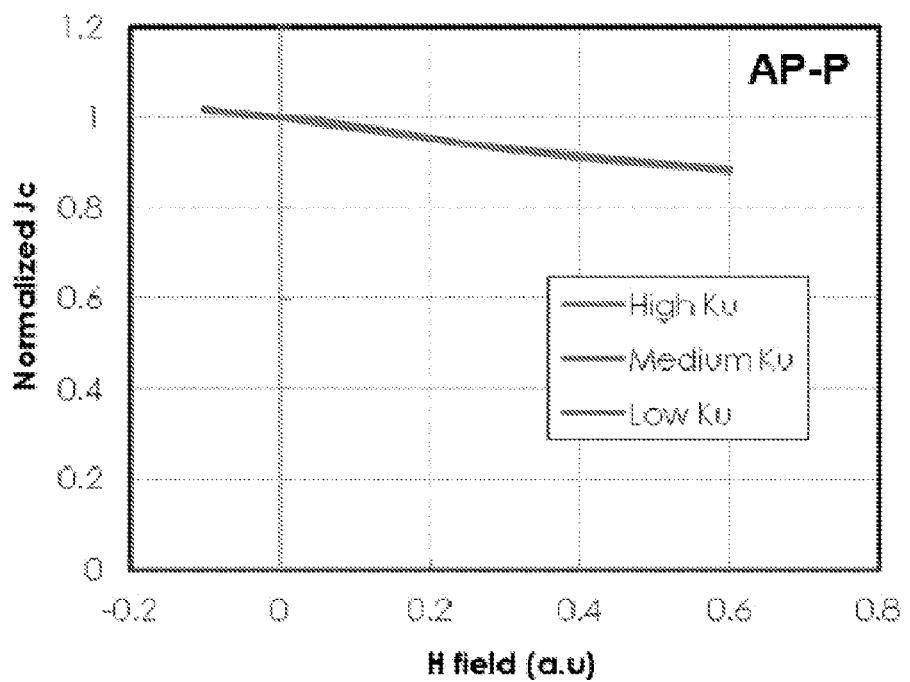

In FIGS. 2a and 2b, "P-AP" means when a storage layer and a fixed layer are switched from the parallel state to the antiparallel state, and "AP-P" means when the storage layer and the fixed layer are switched from the antiparallel state to the parallel state. FIGS. 2a and 2b show the relationship between switching current densities Jc and an external magnetic field (H field) for the P-AP case and the AP-P case, respectively, when switching current densities Jc follow model A and model B. FIGS. 3a and 3b are graphs showing the relationship between switching current densities Jc and an external magnetic field (H Field) for the P-AP case and the AP-P case, respectively, when switching current densities Jc are measured by varying an anisotropy constant value of a fixed layer. The external magnetic field may include a stray field.

Referring to FIGS. 2a and 2b, it can be understood that, in the cases of P-AP and AP-P, the absolute values of the slopes corresponding to each model are identical to each other. Thus, when an external magnetic field is applied in the magnetization direction of a fixed layer, the switching current density increases in the P-AP case as the external magnetic field increases, while the switching current density decreases in the AP-P case as the external magnetic field increases. However, the variation ranges of the switching current densities in the two cases are uniform such that the absolute values of the slopes are identical to each other.

FIGS. 3a and 3b show how the switching current density varies depending on an external magnetic field as the anisotropy constant value varies. In some implementations, a simulation for obtaining the graphs of FIGS. 3a and 3b may be performed using, for example, an LLG simulation.

In the graph of the P-AP case, as shown in FIG. 3a, it can be understood that the switching current density value varies as the anisotropy constant value varies. When the anisotropy constant value is low, the switching current density value varies in a similar manner to model B of FIG. 2a, and has a slope proportional to "$H/Hk$". When the anisotropy constant value is high, the switching current density value varies in a similar manner to model A of FIG. 2a, and has a slope proportional to the square of "$H/Hk$". Since it can be considered that a slope more similar to that of model A allows a variable resistance element to have an anisotropy constant value closer to the optimized anisotropy constant value, it can be considered that a higher slope value in the P-AP graph allows the variable resistance element to have an anisotropy constant value closer to the optimized anisotropy constant value.

In the AP-P graph, as shown in FIG. 3b, the switching current density value changes in the same manner when the variable resistance element has three different Ku values, for example, high $K_u$, medium $K_u$ and low $K_u$. Thus, in FIG. 3b, the switching current density value does not vary depending on the anisotropy constant value. A slope value changes in accordance with that of model A of FIG. 2b in proportional to the square of "$H/H_k$" regardless of the change of the anisotropy constant value. This can be employed as a reference for finding an optimized anisotropy constant value.

Based on FIGS. 2a, 2b, 3a, and 3b, it can be understood that an optimized anisotropy constant value to minimize the switching current of a variable resistance element is obtained when the absolute value of the slope for the P-AP case is greater than or equal to the absolute value of the slope for the AP-P case.

Figure 4:
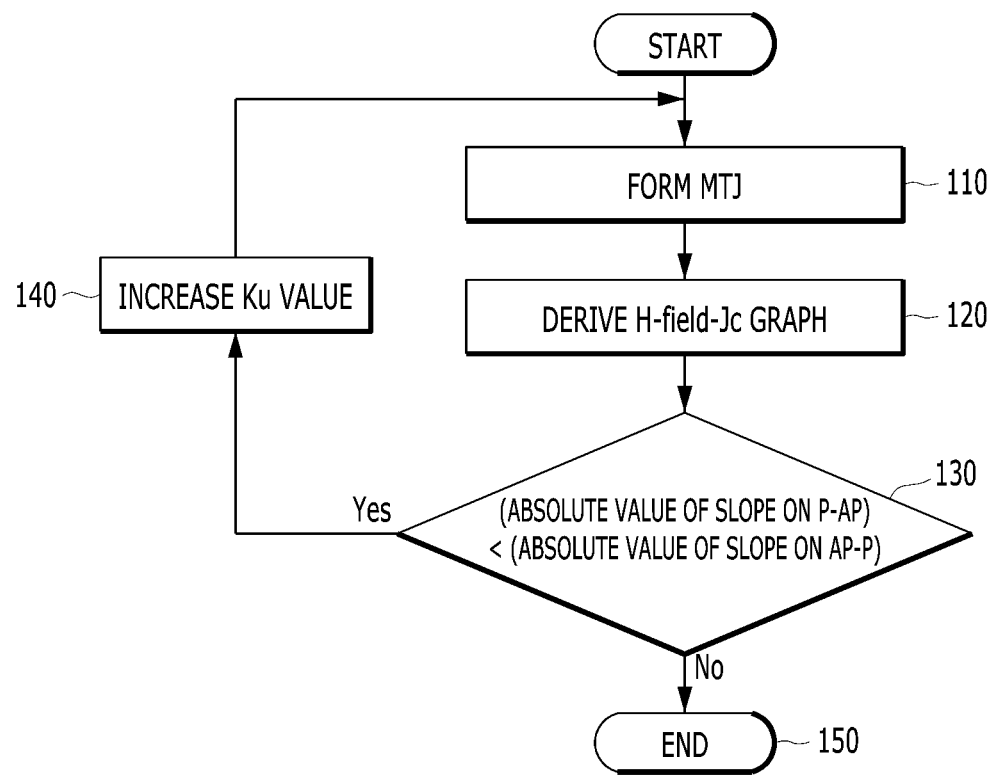
FIG. 4 is an example of a flowchart for deriving a variable resistance element having an optimized $K_u$ value in accordance with an implementation.

FIG. 4 is a flowchart for deriving a variable resistance element having an optimized $K_u$ value in accordance with an implementation.

In step 110, a variable resistance element including a MTJ structure is formed. In some implementations, the MTJ structure includes: a variable layer having a variable magnetization direction; a fixed layer having a fixed magnetization direction; and a tunnel barrier layer interposed between the variable layer and the fixed layer may be formed during a test or a simulation in step 110. In order to form the variable resistance element, a simulation or test is performed beforehand. The simulation or test may be performed for predicting a change in the switching current density for the P-AP case and the AP-P case depending on an external magnetic field. In some implementations, the simulation may be performed using an LLG simulation for solving Landau-Lifshitz-Gilbert (LLG) equation for the magnetic system. Through the simulation or the test, the optimized $K_u$ value is obtained. In step 110, a variable resistance element may be formed to have the obtained optimized $K_u$ value.

In step 120, a graph showing a change in the switching current density can be obtained for each of the P-AP case and the AP-P case. The graph showing the change of the switching current density may include the graph showing the relationship between the switching current densities Jc and the external magnetic field H field. Here, as discussed above, the P-AP case represents when the magnetization directions of the variable layer and the fixed layer are switched from a parallel state to an antiparallel state, and the AP-P case represents when the magnetization directions of the variable layer and the fixed layer are switched from an antiparallel state to a parallel state.

Then, the absolute value of the slope of the graph of the P-AP case is compared with the absolute value of the slope of the graph of the AP-P case in step 130.

Upon the comparison, when the absolute value of the slope of the P-AP graph is less than the absolute value of the slope of the AP-P graph, it means that the switching current has not been minimized. In this case, the $K_u$ value of the fixed layer increases in step 140, and then a series of processes corresponding to steps 110 to 130 may be repeated.

Upon the comparison, when the absolute value of the slope of the P-AP graph is greater than or equal to the absolute value of the slope of the AP-P graph, it means that the switching current has been minimized. Thus, the test or simulation is terminated in step 150. Then, a variable resistance element can be manufactured using the value obtained from the test or simulation.

When the aforementioned method is used, an optimized $K_u$ value can be derived in a relatively simple manner. Thus, it is possible to manufacture a variable resistance element with the minimized switching current without numerous challenges for manufacturing variable resistance elements.

According to the electronic device in accordance with the implementation, the characteristics of the variable resistance element can be improved.

The above and other memory circuits or semiconductor devices based on the disclosed technology can be used in a range of devices or systems. FIGS. 5-9 provide some examples of devices or systems that can implement the memory circuits disclosed herein.

Figure 5:
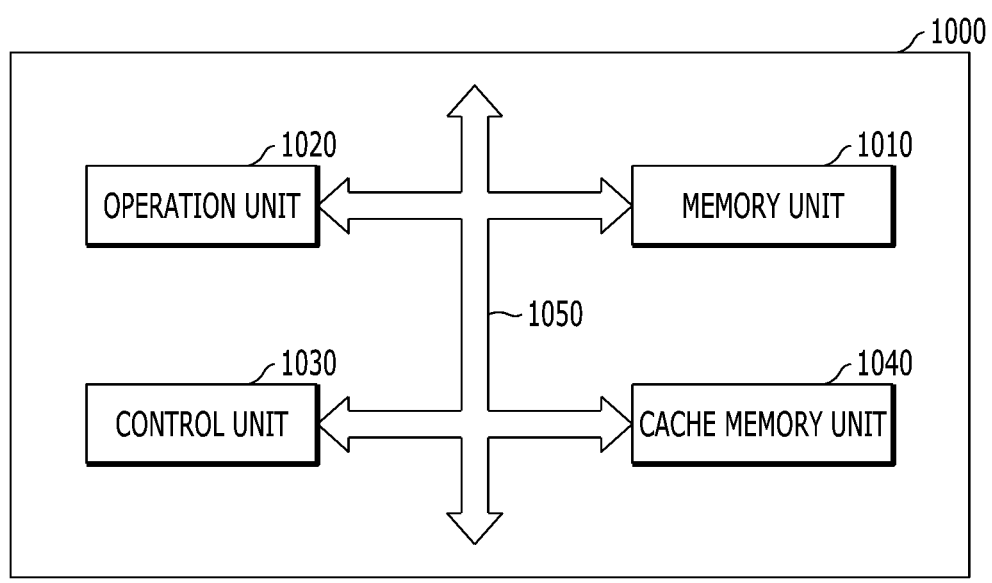
FIG. 5 is an example of configuration diagram of a microprocessor implementing memory circuitry based on the disclosed technology.

FIG. 5 is an example of configuration diagram of a microprocessor implementing memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element capable of being included in the semiconductor memory, and including a fixed layer, a tunnel barrier layer, and a variable layer laminated therein, wherein the variable resistance element is capable of allowing a slope of a graph of a switching current density as a function of an external magnetic field to be proportional to the square of "H/Hk" when the magnetization directions of the fixed layer and the variable layer are switched from a parallel state to an antiparallel state. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
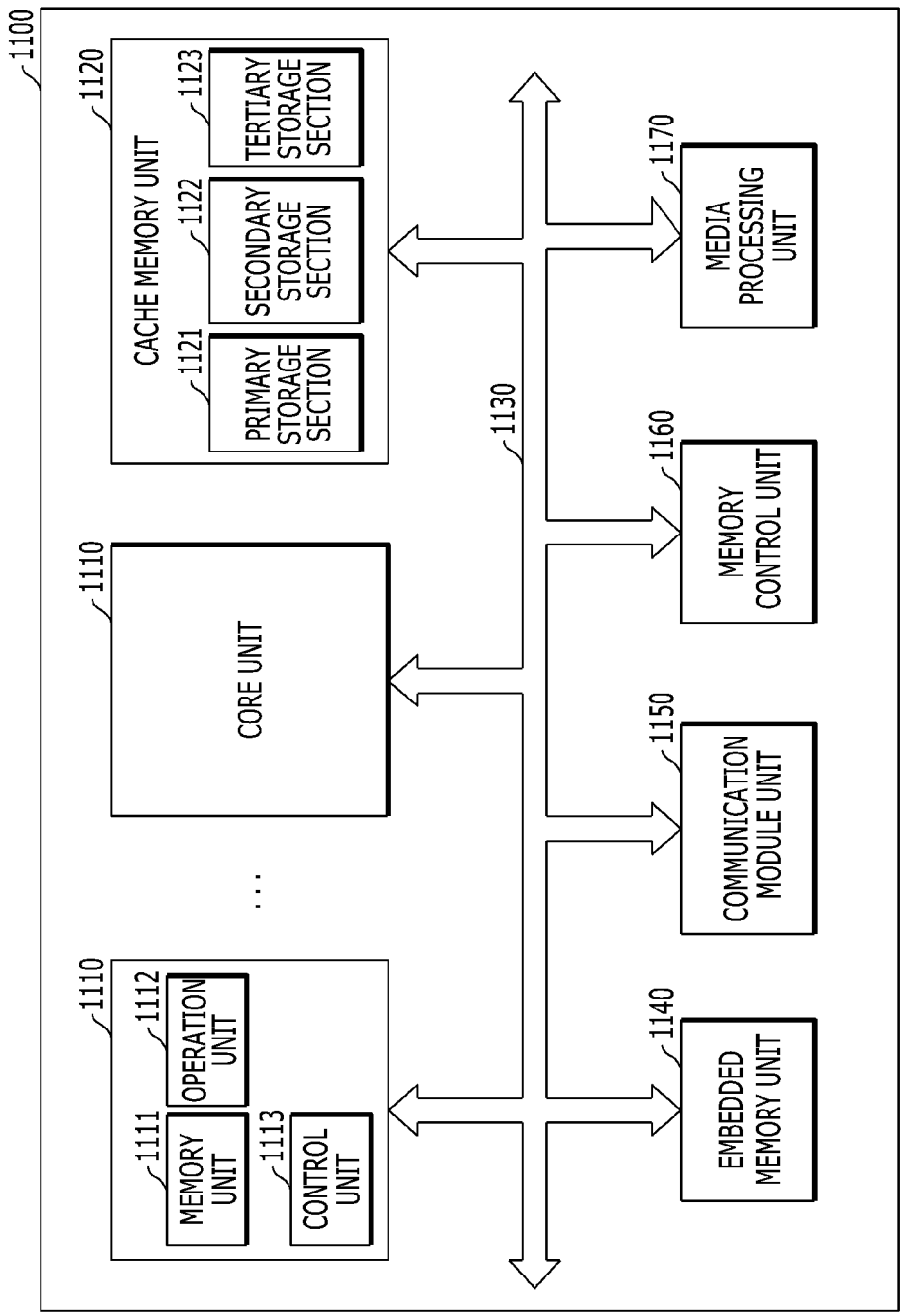
FIG. 6 is an example of configuration diagram of a processor implementing memory circuitry based on the disclosed technology.

FIG. 6 is an example of configuration diagram of a processor implementing memory circuitry based on the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element capable of being included in the semiconductor memory, and including a fixed layer, a tunnel barrier layer, and a variable layer laminated therein, wherein the variable resistance element is capable of allowing a slope of a graph of a switching current density as a function of an external magnetic field to be proportional to the square of "H/Hk" when the magnetization directions of the fixed layer and the variable layer are switched from a parallel state to an antiparallel state. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
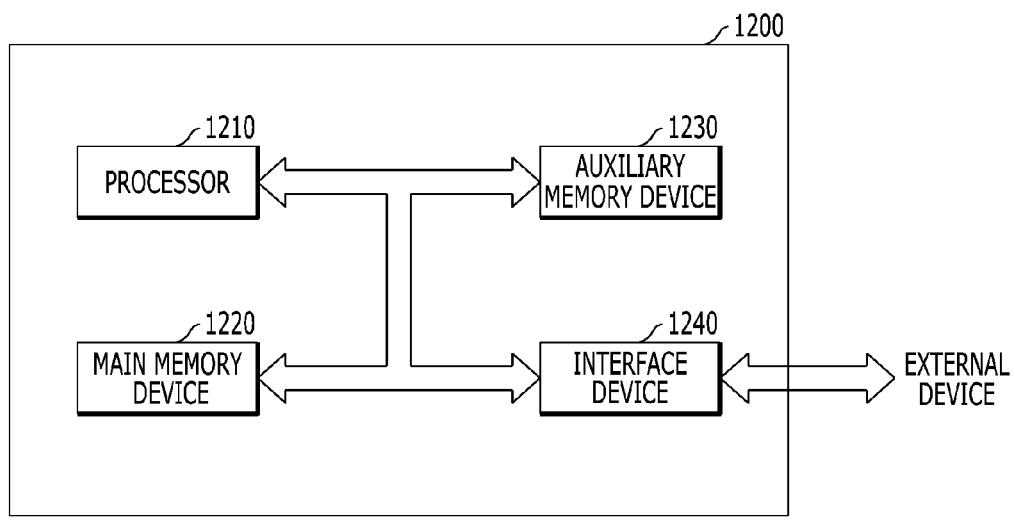
FIG. 7 is an example of configuration diagram of a system implementing memory circuitry based on the disclosed technology.

FIG. 7 is an example of configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element capable of being included in the semiconductor memory, and including a fixed layer, a tunnel barrier layer, and a variable layer laminated therein, wherein the variable resistance element is capable of allowing a slope of a graph of a switching current density as a function of an external magnetic field to be proportional to the square of "H/Hk" when the magnetization directions of the fixed layer and the variable layer are switched from a parallel state to an antiparallel state. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element capable of being included in the semiconductor memory, and including a fixed layer, a tunnel barrier layer, and a variable layer laminated therein, wherein the variable resistance element is capable of allowing a slope of a graph of a switching current density as a function of an external magnetic field to be proportional to the square of "H/Hk" when the magnetization directions of the fixed layer and the variable layer are switched from a parallel state to an antiparallel state. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
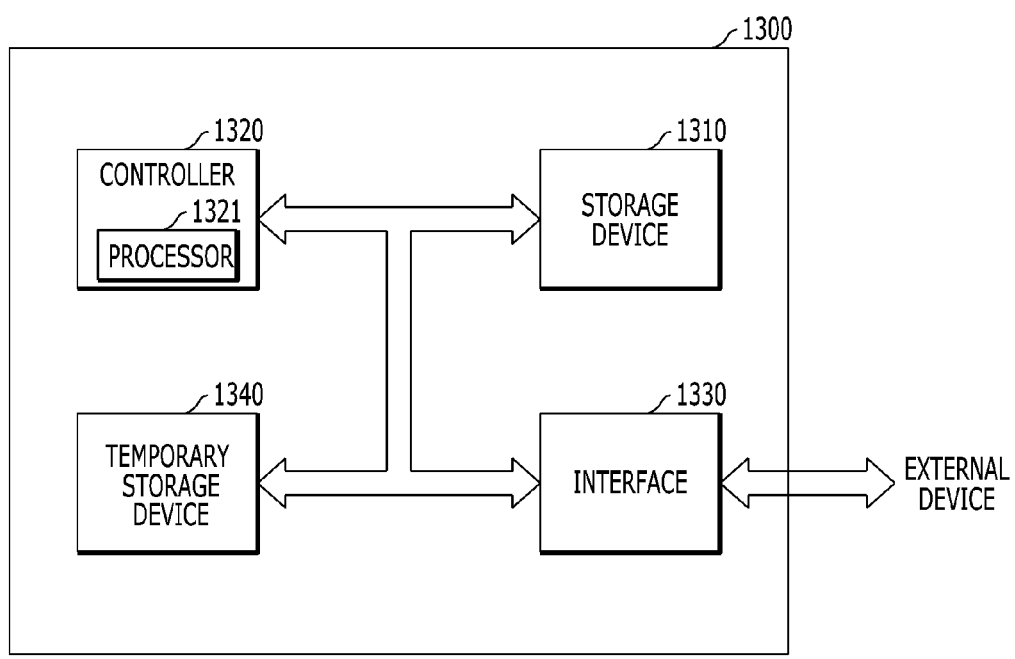
FIG. 8 is an example of configuration diagram of a data storage system implementing memory circuitry based on the disclosed technology.

FIG. 8 is an example of configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element capable of being included in the semiconductor memory, and including a fixed layer, a tunnel barrier layer, and a variable layer laminated therein, wherein the variable resistance element is capable of allowing a slope of a graph of a switching current density as a function of an external magnetic field to be proportional to the square of "H/Hk" when the magnetization directions of the fixed layer and the variable layer are switched from a parallel state to an antiparallel state. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 9:
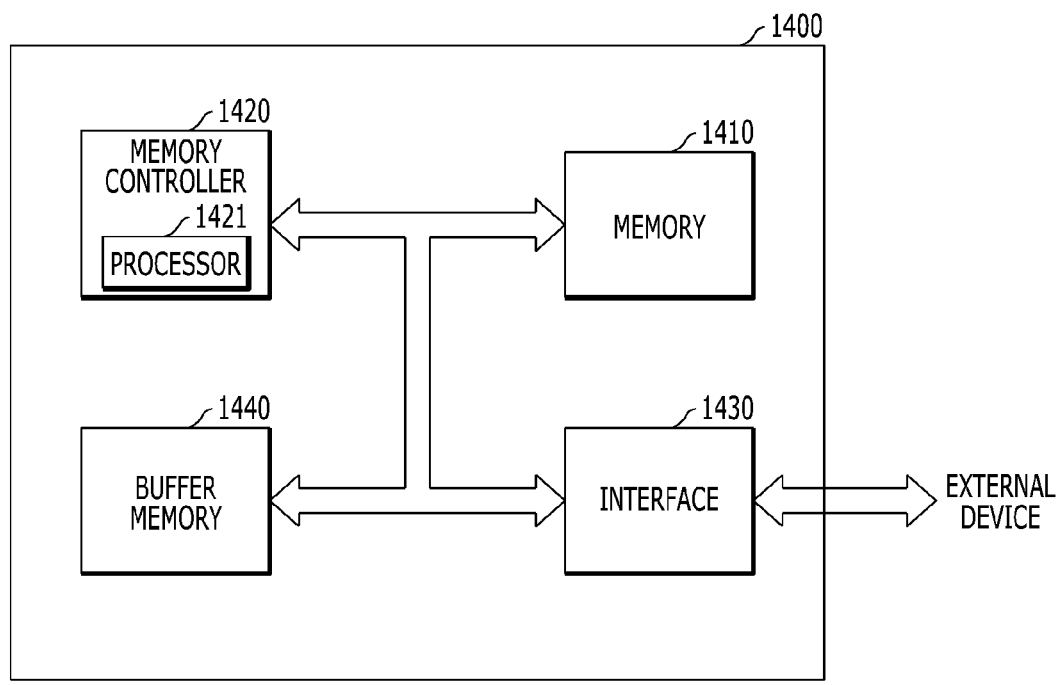
FIG. 9 is an example of configuration diagram of a memory system implementing memory circuitry based on the disclosed technology.

FIG. 9 is an example of configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element capable of being included in the semiconductor memory, and including a fixed layer, a tunnel barrier layer, and a variable layer laminated therein, wherein the variable resistance element is capable of allowing a slope of a graph of a switching current density as a function of an external magnetic field to be proportional to the square of "H/Hk" when the magnetization directions of the fixed layer and the variable layer are switched from a parallel state to an antiparallel state. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element capable of being included in the semiconductor memory, and including a fixed layer, a tunnel barrier layer, and a variable layer laminated therein, wherein the variable resistance element is capable of allowing a slope of a graph of a switching current density as a function of an external magnetic field to be proportional to the square of "H/Hk" when the magnetization directions of the fixed layer and the variable layer are switched from a parallel state to an antiparallel state. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated in this patent document.

What is claimed is:

1. An electronic device comprising semiconductor memory, wherein the semiconductor memory comprises:
   a variable resistance element comprising a fixed layer, a variable layer, and a tunnel barrier layer interposed between the fixed layer and the variable layer, the variable resistance element exhibiting a magnetic anisotropy field, Hk,
   wherein the variable resistance element has a characteristic that a switching current density of the variable resistance element is a function of an external magnetic field, H, around the variable resistance element, the function being proportional to a square of a ratio of "H/Hk" when the magnetization directions of the fixed layer and the variable layer are switched from a parallel state to an antiparallel state.

2. The electronic device of claim 1, wherein the variable resistance element is structured so that, as the external magnetic field increases, the switching current density of the variable resistance element increases.

3. The electronic device of claim 1, wherein the variable layer and the fixed layer include ferromagnetic materials.

4. The electronic device of claim 1, wherein the tunnel barrier layer includes an oxide.

5. The electronic device of claim 1, wherein the switching current of the variable resistance element is minimized when the fixed layer has an optimized anisotropy constant Ku.

6. The electronic device according to claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory unit that includes the resistance variable element is part of the memory unit in the microprocessor.

7. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory unit that includes the resistance variable element is part of the cache memory unit in the processor.

8. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory unit that includes the resistance variable element is part of the auxiliary memory device or the main memory device in the processing system.

9. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit that includes the resistance variable element is part of the storage device or the temporary storage device in the data storage system.

10. The electronic device according to claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory unit that includes the resistance variable element is part of the memory or the buffer memory in the memory system.

11. An electronic device comprising a semiconductor memory, wherein the semiconductor memory comprises:
a variable resistance element comprising a fixed layer, a variable layer, a tunnel barrier layer interposed between the fixed layer and the variable layer and switched between a parallel state and an antiparallel state, wherein the parallel state is defined when the variable layer and the fixed layer have parallel magnetization directions from each other and the antiparallel state is defined when the variable layer and the fixed layer have antiparallel magnetization directions from each other,
wherein structures and materials of the fixed layer, the variable layer and the tunnel barrier layer of the variable resistance element are selected to cause the variable resistance element to have a switching current density that depends on an external magnetic field in form of a first function of the external magnetic field when the variable resistance element switches from the parallel state to the antiparallel state, wherein the first function has a slope with an absolute value greater than or equal to an absolute value of a slope of a second function between the switching current density and the external magnetic field when the variable resistance element switches from the antiparallel state to the parallel state.

12. The electronic device of claim 11, wherein the first function has a characteristic that as the external magnetic field increases, the switching current density of the variable resistance element increases.

13. The electronic device of claim 11, wherein the second function has a characteristic that as the external magnetic field increases, the switching current density of the variable resistance element decreases.

14. The electronic device of claim 11, wherein the variable layer and the fixed layer include ferromagnetic materials.

15. The electronic device of claim 11, wherein the tunnel barrier layer includes an oxide.

16. The electronic device of claim 11, wherein the switching current of the variable resistance element is minimized when the fixed layer has an optimized anisotropy constant $K_u$.

* * * * *